(12) United States Patent
Tiihonen et al.

(10) Patent No.: US 6,621,368 B2
(45) Date of Patent: Sep. 16, 2003

(54) DYNAMIC RANGE EXTENSION FOR AN ELECTRONIC CIRCUIT

(75) Inventors: Markku J. Tiihonen, Oulu (FI); Taisto Soikkeli, Kiiminki (FI)

(73) Assignee: Remec Oy, Oulu (FI)

( * ) Notice: Subject to any disclaimer, the term of this patent is extended or adjusted under 35 U.S.C. 154(b) by 0 days.

(21) Appl. No.: 09/875,322

(22) Filed: Jun. 6, 2001

(65) Prior Publication Data
US 2003/0020558 A1 Jan. 30, 2003

(51) Int. Cl.[7] ............................................... H03H 11/24
(52) U.S. Cl. ..................... 333/17.1; 333/81 R
(58) Field of Search ............................. 333/17.1, 81 R, 333/174; 330/296

(56) References Cited

U.S. PATENT DOCUMENTS

| 4,812,851 A | * | 3/1989 | Giubardo ................... 342/389 |
| 5,483,209 A | * | 1/1996 | Takayama ................... 333/174 |
| 6,005,267 A | | 12/1999 | Griffin et al. |
| 6,144,254 A | | 11/2000 | Irvine et al. |

FOREIGN PATENT DOCUMENTS

EP 0 962 999 12/1999

* cited by examiner

*Primary Examiner*—Seungsook Ham
(74) *Attorney, Agent, or Firm*—Heller Ehrman White & McAuliffe

(57) ABSTRACT

A circuit for extending the dynamic range of an electronic circuit is provided. The circuit includes a first adjustable attenuation circuit having an input and an output and a control input. The control input is adapted to receive a control signal that adjusts the relative gain of the attenuation circuit. The circuit also includes at least one additional attenuation circuit coupled in parallel with the first adjustable attenuation circuit. The at least one additional attenuation circuit has a control input that is adapted to receive a control signal that adjusts the relative gain of the at least one additional attenuation circuit. The first and the at least one additional attenuation circuits are selectively controlled to adjust the level of signals in different frequency bands so as to extend the dynamic range of signals to be processed by the electronic circuit.

29 Claims, 3 Drawing Sheets

DYNAMIC RANGE EXTENSION FOR AN ELECTRONIC CIRCUIT

TECHNICAL FIELD

The present invention relates generally to the field of electronic circuits and, in particular, to dynamic range extension for electronic circuits.

BACKGROUND

Electronic systems typically include a large number of modules or electronic circuits. Each electronic circuit provides a specified functionality within the electronic system. Conventionally, electronic circuits process signals that are analog signals, digital signals or both. Converters that transform signals between digital and analog form are commonplace electronic circuits.

One limitation on the operation of these converters is the "dynamic range" of input signals that can be processed by the converters. For purposes of this specification, the term dynamic range refers to the amplitude or magnitude of signals that can be processed by the converter. Typically, converters that have a high dynamic range are also expensive. Less expensive converters typically have a more limited dynamic range. This problem with the dynamic range of converters is particularly relevant in so-called "broadband" systems that process signals over a high dynamic range over a wide frequency band.

For the reasons stated above, and for other reasons stated below which will become apparent to those skilled in the art upon reading and understanding the present specification, there is a need in the art for an economical technique to improve the dynamic range of existing electronic circuits, e.g., analog-to-digital (A/D) and digital-to-analog (D/A) converters.

SUMMARY

The above-mentioned problems with the dynamic range of electronic circuits and other problems are addressed by embodiments of the present invention and will be understood by reading and studying the following specification. Embodiments of the present invention flatten signals applied to an electronic circuit by selectively controlling the signal level of different frequency bands of the signal so as to extend the dynamic range of an electronic circuit, e.g., the dynamic range of an analog to digital converter.

More particularly, in one embodiment a circuit for extending the dynamic range of an electronic circuit is provided. The circuit includes a first adjustable attenuation circuit having an input and an output and a control input. The control input is adapted to receive a control signal that adjusts the relative gain of the first attenuation circuit. The circuit also includes at least one additional attenuation circuit coupled in parallel with the first adjustable attenuation circuit. The at least one additional attenuation circuit has a control input that is adapted to receive a control signal that adjusts the relative gain of the at least one additional attenuation circuit. The first and the at least one additional attenuation circuits are selectively controlled to adjust the level of signals in different frequency bands so as to extend the dynamic range of signals to be processed by the electronic circuit.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Embodiments of the present invention improve the dynamic range of existing electronic circuits at a substantially reduced cost compared to conventional electronics circuits of the same or similar dynamic range. Essentially, an input signal for the electronic circuit is divided over a number of frequency bands. The signal level for each frequency band is separately adjusted so that the signal applied to the electronic circuit effectively has a wider flat portion. Thereby, embodiments of the present invention improve the dynamic range of the electronic circuit.

Figure 1:
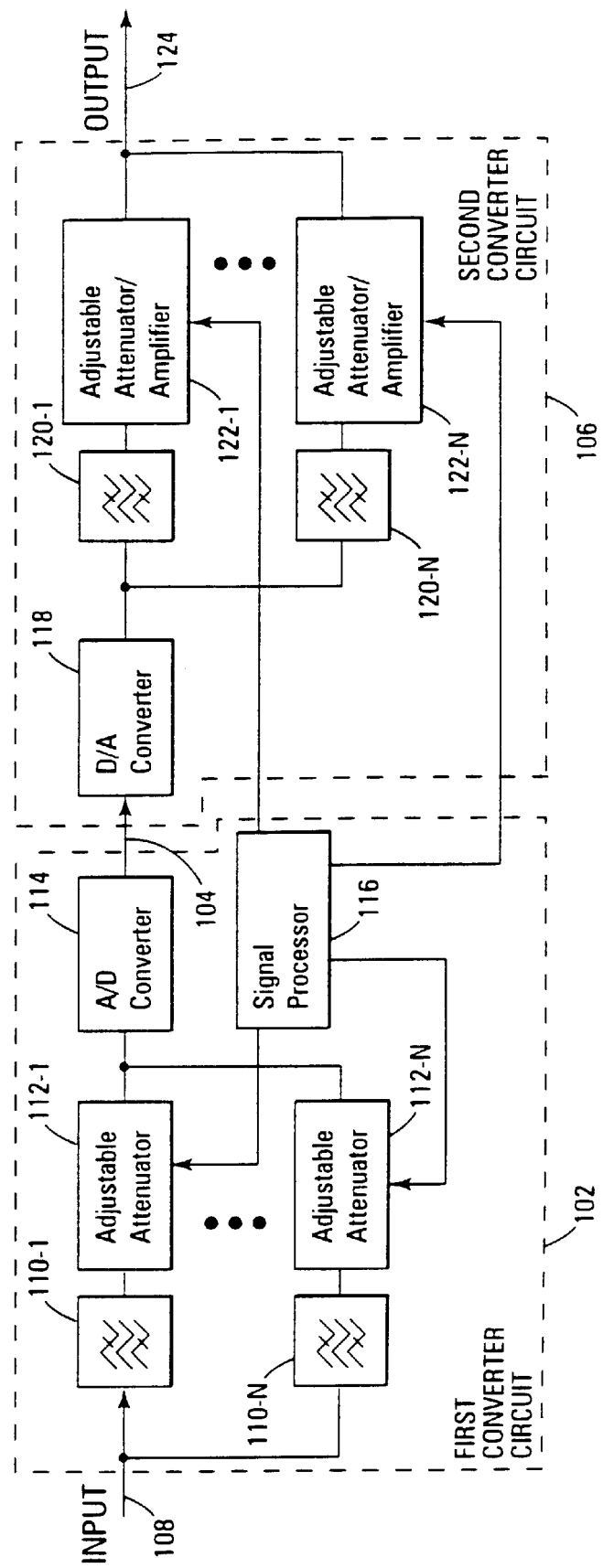
FIG. 1 is a block diagram of an embodiment of a communication circuit according to the teachings of the present invention.

FIG. 1 is a block diagram of an embodiment of a communication system, indicated generally at 100, according to the teachings of the present invention. System 100 includes first converter circuit 102 coupled to second converter circuit 106 over communication link 104.

First converter circuit 102 converts signals from analog to digital format. First converter circuit 102 includes input 108. Input 108 is adapted to receive analog signals, e.g., an analog radio frequency (RF) signal. Input 108 is coupled to a plurality of bandpass filters 110-1, . . . 110-N. Each of bandpass filters 110-1, . . . , 110-N passes signals in a selected frequency band of the signal received at input 108. In one embodiment, bandpass filters 110-1, . . . , 110-N are each constructed using microelectromechanical resonators. In other embodiments, bandpass filters 110-1, . . . , 110-N are implemented using coaxial filters, SAW filters or an LC construction with the inductor formed using microelectromechanical structures. In many embodiments, the size of the filters is significant, both economically and for product design, because a large number of filters, e.g., 100 or more, are used to extend the dynamic range of the electronic circuit. Thus, filters based on microelectromechanical structures are desirable in many applications.

Each of bandpass filters 110-1, . . . 110-N is coupled to a corresponding adjustable attenuator 112-1, . . . , 112-N. It is noted that the term attenuator as used in this specification encompasses attenuators and amplifiers since an attenuator can be thought of as an amplifier with a gain of less than 1. In some embodiments, one or more of adjustable attenuators 112-1, . . . , 112-N may provide a gain of greater than 1.

Each adjustable attenuator 112-1, . . . , 112-N has an output that is coupled to the input of analog to digital (A/D) converter 114. A/D converter 114 has an output that is coupled to communication link 104. A/D converter 114 converts the analog signal received at input 108 into a digital signal for transmission over communication link 104. Advantageously, first converter circuit 102 has a dynamic range that exceeds the dynamic range of A/D converter 114. Thus, signals with a wider amplitude range can be properly converted to digital format by first converter circuit 102 as compared to A/D converter 114 operating independently.

Signal processor 116 is coupled to control the attenuation of signal by adjustable attenuators 112-1, . . . , 112-N so as to produce the effective increase in dynamic range for first converter circuit 102. Signal processor 116 is coupled to analog to digital converter 114. Signal processor 116 receives the output of analog to digital converter 114. Based on these output signals, signal processor 116 further provides control signals to each of adjustable attenuators 112-1, . . . , 112-N so as to effectively flatten out the signal seen at the input of analog to digital converter 114 over a wider frequency spectrum. In one embodiment, these control signals each comprise M-bit signals that selectively adjust the attenuation of one of adjustable attenuators 112-1, . . . , 112-N through operation of microelectromechanical switches.

Second converter circuit 106 converts the digital signal received from first converter circuit 102 back to analog form for transmission at output 124. Second converter circuit 106 includes digital to analog converter 118. Digital to analog converter 118 is coupled to communication link 104. Further, digital to analog converter 118 is also coupled to bandpass filters 120-1, . . . , 120-N. Each of bandpass filters 120-1, . . . , 120-N is coupled to a respective adjustable attenuator/amplifier 122-1, 122-N. The output of each of adjustable attenuator/amplifiers 122-1, . . . , 122-N is coupled to output 124. In this embodiment, adjustable attenuator/amplifiers 122-1, . . . , 122-N are coupled to receive a control signal from signal processor 116. In this manner, the original signal received at input 108 is reproduced at the output 124 of system 100. Signal processor 116 generates control signals that selectively adjust the attenuation or gain of adjustable attenuator/amplifiers 122-1, . . . , 122-N so as to compensate for changes in signal level introduced by adjustable attenuators 112-1, . . . , 112-N.

Figure 4:
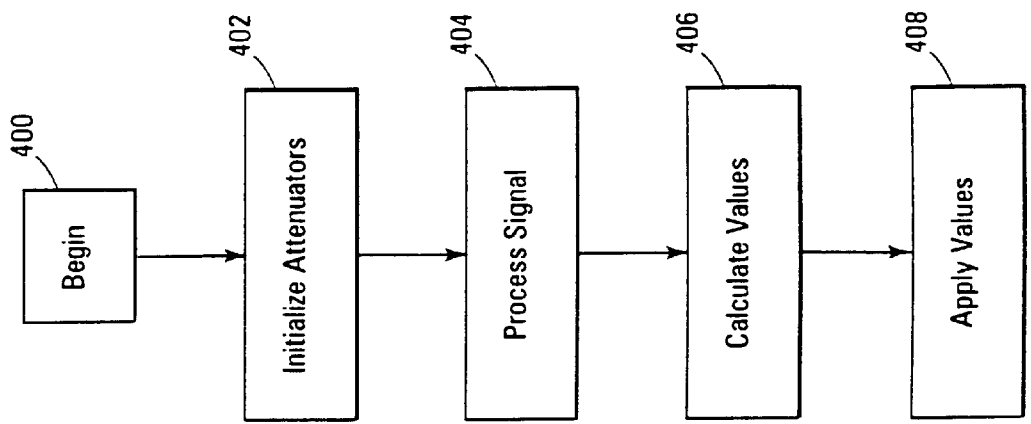
FIG. 4 is a flow chart of one embodiment of a process for extending the dynamic range of an electronic circuit according to the teachings of the present invention.

In operation, system 100 transports signals from input 108 to output 124 using first and second converter circuits 102 and 106 over communication link 104. The operation of system 100 is described in conjunction with the flowchart of FIG. 4.

The method begins at block 400. At block 402, signal processor 116 initializes adjustable attenuators 112-1, . . . , 112-N to an initial attenuation value, e.g., 0 dB. Similarly, signal processor 116 generates control signals that adjust the gain of adjustable attenuator/amplifiers 122-1, . . . , 122-N.

At block 404, analog to digital converter 114 processes signals received at input 108. Based on the signals processed by analog to digital converter 114, signal processor 116 calculates values for adjustable attenuators 112-1, . . . , 112-N and adjustable attenuator/amplifiers 122-1, . . . , 122-N at block 406 to provide a substantially flat input signal over a wide range of frequencies. These values are calculated to extend the normal dynamic range of analog to digital converter 114 and to allow the signal from input 108 to be reconstructed at output 124.

Figure 2:
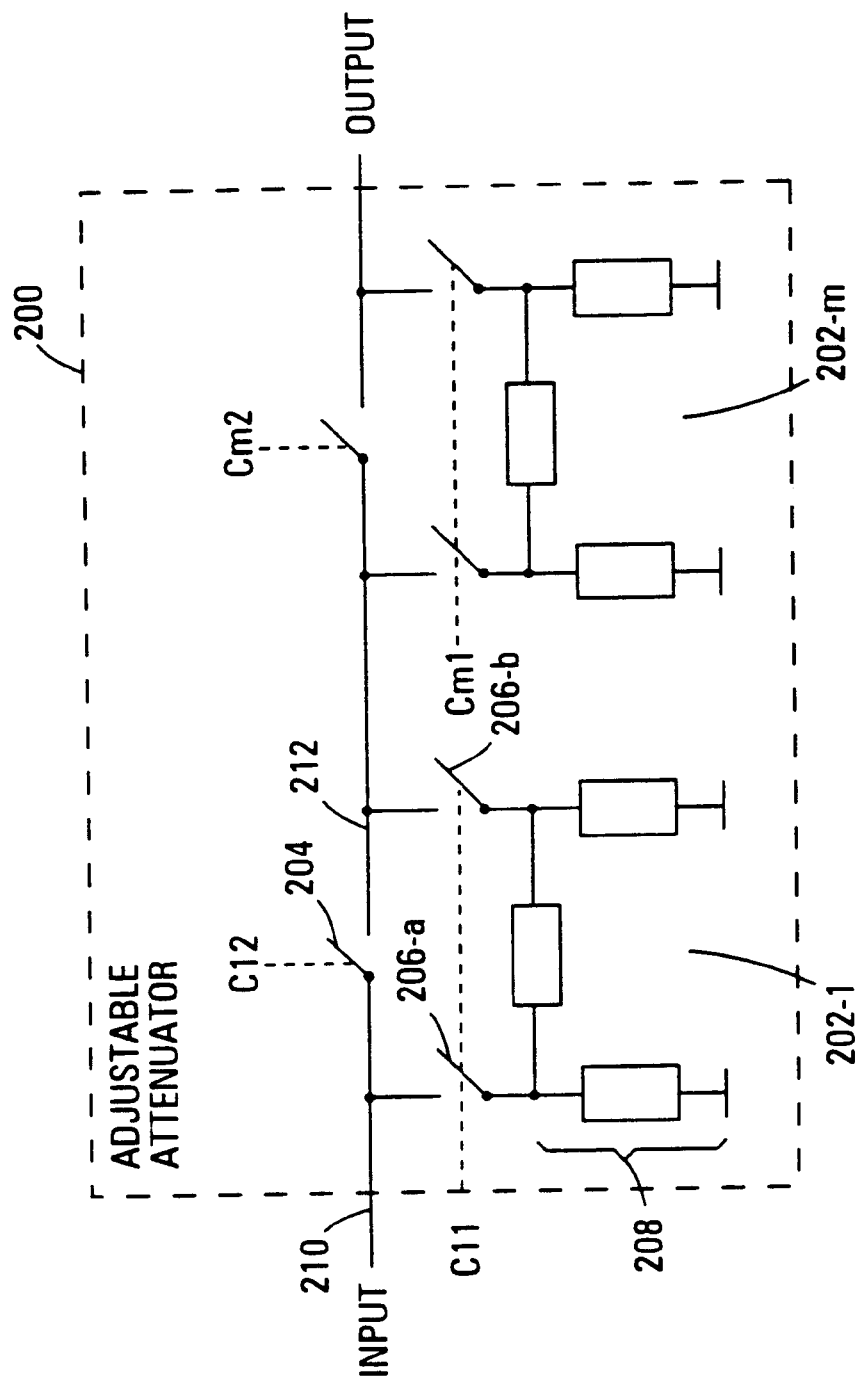
FIG. 2 is a block diagram of an embodiment of an attenuator circuit according to the teachings of the present invention.

FIG. 2 is a block diagram of an embodiment of an adjustable attenuator circuit, indicated generally at 200, according to the teachings of the present invention. Adjustable attenuator 200 includes a plurality of attenuation stages 202-1, . . . , 202-M. Each attenuation stage is constructed in a similar manner and uses microelectromechanical switches to selectively bypass the stage so as to achieve the desired attenuation for the adjustable attenuator. Due to the similarity in each of the stages, only attenuation stage 202-1 is described in detail. It is understood however, that the other attenuation stages are constructed and operate in a similar manner.

Attenuation stage 202-1 includes bypass switch 204 and pass switches 206-a 206-b. Further, attenuation stage 202-1 also includes attenuation circuit 208. As shown, attenuation circuit 208 comprises a "pi" configuration. However, it is understood, that other appropriate attenuation circuits can also be used in place of the pi configuration. Bypass switch 204 is coupled in parallel with attenuation stage 208 between input 210 and the next succeeding attenuation stage. Pass switches 206-a and 206-b are coupled to allow attenuation stage 208 to be selectively disconnected from signal path 212 of adjustable attenuator 200.

Adjustable attenuator 200 receives control signals for each of the attenuation stages 202-1, . . . , 202-M. These control signals select whether to bypass or in corporate the attenuation of each of the attenuation stages in adjustable attenuator 200. The attenuation value for the adjustable attenuators, in one embodiment, comprise attenuation levels selected in powers of two, e.g., 1, 2, 4, 8, etc. For example, in one embodiment, adjustable attenuator 200 includes five stages. Stage 202-1 has an attenuation level of 1 dB, stage 202-2 has an attenuation level of 2 dB, stage 202-3 has attenuation level of 4 dB, stage 202-4 has an attenuation level of 8 dB and stage 202-5 has an attenuation level of 16 dB. Table 1 below shows sample control signals used with these attenuation levels to achieve a variety of attenuation levels for adjustable attenuator 200. It is understood, however, that this example is provided by way of illustration and not by way of limitation. Other attenuation levels for each stage are used in other embodiments as needed for a specific implementation.

| C 11 | C 12 | C 21 | C 22 | C 31 | C 32 | C 41 | C 42 | C 51 | C 52 | Attenuation |
|---|---|---|---|---|---|---|---|---|---|---|
| 0 | 1 | 0 | 1 | 0 | 1 | 0 | 1 | 0 | 1 | 0 dB |
| 1 | 0 | 0 | 1 | 0 | 1 | 0 | 1 | 0 | 1 | 1 dB |
| 0 | 1 | 1 | 0 | 0 | 1 | 0 | 1 | 0 | 1 | 2 dB |
| 1 | 0 | 1 | 0 | 0 | 1 | 0 | 1 | 0 | 1 | 3 dB |
| 0 | 1 | 1 | 0 | 0 | 1 | 1 | 0 | 0 | 1 | 10 dB |
| 0 | 1 | 0 | 1 | 1 | 0 | 1 | 0 | 0 | 1 | 20 dB |
| 0 | 1 | 1 | 0 | 1 | 0 | 1 | 0 | 1 | 0 | 30 dB |
| 1 | 0 | 1 | 0 | 1 | 0 | 1 | 0 | 1 | 0 | 31 dB |

In some embodiments, the circuitry described above for extending the dynamic range of an electronic circuit is fabricated as an integrated circuit on a semiconductor substrate. For example, adjustable attenuator 200 of FIG. 2 and first and second converter circuits 102 and 106 of FIG. 1 or portions thereof are fabricated as integrated circuits. Further, in other embodiments, the various components that provide for dynamic range extension comprise discrete components.

Figure 3:
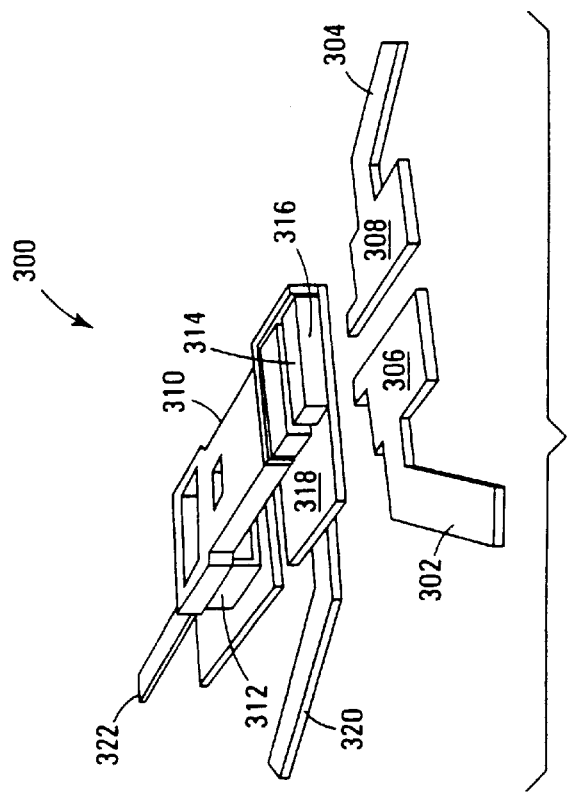
FIG. 3 is a perspective view of an embodiment of a microelectromechanical switch for a variable attenuator according to the teachings of the present invention.

FIG. 3 is a perspective view of an embodiment of a microelectromechanical switch, indicated generally at 300, for a variable attenuator according to the teachings of the present invention. Switch 300 is an example of one type of switch that is usable in adjustable attenuator 200 of FIG. 2. It is understood, however, that switch 300 is provided by way of example and not by way of limitation. Other microelectromechanical switches are used in other embodiments.

Switch 300 provides selectable connection between leads 302 and 304. Switch 300 includes arm 310 that extends from base 312 to a point outward from a surface of contact pads 306 and 308. Contact pads 306 and 308 are coupled to leads 302 and 304, respectively. Arm 310 further includes conductive member 314 disposed at end 316 that is adapted to provide electrical connection between contact pads 306 and 308 when arm 310 is activated as described in more detail below.

Switch 300 is controlled by a signal received at control contact 318 over control line 320 to provide selectable connection between leads 302 and 304. Switch 300 further includes a common contact 322 to provide grounding for switch 300.

In operation, switch 300 provides selectable connection between leads 302 and 304. When the connection is to be made, switch 300 receives a control signal on line 320. The signal on control line 320 charges up control contact 318. This voltage in turn causes end 316 of arm 310 to rotate toward contact pads 306 and 308. When contact is made, conductive member 314 electrically connects lead 302 and 304 together.

When the control signal on control line 320 changes states, switch 300 opens. Arm 310 returns to its original position thereby breaking the connection between leads 302 and 304.

Although specific embodiments have been illustrated and described in this specification, it will be appreciated by those of ordinary skill in the art that an arrangement that is calculated to achieve the same purpose may be substituted for the specific embodiment shown. This application is intended to cover any adaptations or variations of the present invention. For example, other microelectromechanical switches are used in other embodiments to implement adjustable attenuators. Further, this approach to increasing the dynamic range of an electronic circuit is used in other embodiments with circuits other than analog to digital converters. Electronic circuits that have a limited dynamic range compared to a natural, a useful or a required signal amplitude range will benefit from using the dynamic range extension described above. For example, circuits such as receivers, sensors, amplifiers, and other circuits used in such applications. Further, any attenuator circuit can be replaced with a variable gain amplifier. Further, the term microelectromechanical devices is defined to include the class of devices known as nanoelectromechanical devices.

What is claimed is:

1. A circuit for extending the dynamic range of an electronic circuit, the circuit comprising:

a first adjustable attenuation circuit having an input and an output and a control input, the control input adapted to receive a control signal that adjusts the relative gain of the first attenuation circuit;

at least one additional attenuation circuit coupled in parallel with the first adjustable attenuation circuit, the at least one additional attenuation circuit having a control input adapted to receive a control signal that adjusts the relative gain of the at least one additional attenuation circuit; and wherein the first and the at least one additional attenuation circuits are selectively controlled to adjust the level of signals in different frequency bands in a combined output of the attenuation circuits so as to extend the dynamic range of signals processed by the electronic circuit.

2. The circuit of claim 1, wherein the first adjustable attenuation circuit comprises a plurality of stages that are selectively interconnected through a plurality of microelectromechanical switches to establish the attenuation level of the first adjustable attenuation circuit.

3. The circuit of claim 2, wherein each of the stages comprises an attenuator with an attenuation level that is a power of 2 in dB.

4. The circuit of claim 1, wherein the first adjustable attenuation circuit comprises:

a first attenuation circuit;

at least one additional attenuation circuit; and a plurality of microelectromechanical switches that selectively couple the first attenuation circuit and the at least one additional attenuation circuit between an input and an output of the first adjustable attenuation circuit so as to establish the attenuation level of the first adjustable attenuation circuit.

5. The circuit of claim 1, wherein the first adjustable attenuatin circuit and the at least one additional attenuation circuit each comprise a plurality of stages, wherein each stage comprises an attenuation stage with an attenuation level that is a power of 2 in dB.

6. The circuit of claim 1, wherein the first adjustable attenuation circuit and the at least one additional attenuation circuit each include a control port that is adapted to receive an n-bit control signal from a signal processor to establish a selected attenuation level.

7. The circuit of claim 1, wherein the first adjustable attenuation circuit and the at least one additional attenuation circuit each include a bandpass filter that limits the affect of the attenuation to a selected frequency band.

8. The circuit of claim 1, wherein the at least one additional attenuation circuit comprises a plurality of attenuation circuits.

9. The circuit of claim 8, wherein the plurality of attenuation circuits are coupled in parallel.

10. A method for extending the dynamic range of an electronic circuit, the method comprising:

receiving a signal:

providing the signal to the electronic circuit;

monitoring signal levels of the signals applied to the circuit over a plurality of signal bands; and selectively adjusting the gain applied to the plurality of signal bands in response to the respective signal level to adjust the dynamic range of the signals applied to the electronic circuit.

11. The method of claim 10, wherein receiving a signal comprises receiving an analog RF signal.

12. The method of claim 10, wherein monitoring signal levels comprise monitoring signals output by an analog to digital converter.

13. The method of claim 10, and further comprising setting an initial attenuation level for all signal bands prior to monitoring signal levels.

14. The method of claim 10, wherein providing the signal to the electronic circuit comprises providing the signal to an analog to digital converter.

15. An circuit for converting analog signals to digital signals, the circuit comprising:
    a signal input that is adapted to receive the analog signal;
    a plurality of bandpass filters coupled to the signal input that pass the analog signal in a plurality of different bands;
    a plurality of adjustable attenuators, each coupled to a corresponding one of the plurality of bandpass filters, each adjustable attenuator further including a control input;
    an analog to digital converter having a first dynamic range, the digital to analog converter coupled to the output of each of the plurality of adjustable attenuators; and
    a signal processing circuit, coupled to the analog to digital converter, that is adapted to monitor the signal level in each of the plurality of different bands and to provide control signals to the plurality of adjustable attenuators in response to the respective signal level so as to establish attenuation levels for each of the plurality of bands based on the output of the analog to digital converted so as to extend the first dynamic range of the analog to digital converted to a second, higher dynamic range.

16. The circuit of claim 15, wherein each of the plurality of adjustable attenuators comprises a plurality of stages that are selectively interconnected through a plurality of microelectromechanical switches to establish the attenuation level of the adjustable attenuator.

17. The circuit of claim 16, wherein each of the stages comprises an attenuator with an attenuation level that is a power of 2 in dB.

18. The circuit of claim 15, wherein each of the plurality of adjustable attenuators comprises:
    a first attenuation circuit;
    at least one additional attenuation circuit; and
    a plurality of microelectromechanical switches that selectively couple the first attenuation circuit and the at least one additional attenuation circuit between an input and an output of the adjustable attenuator so as to establish the attenuation level of the adjustable attenuator.

19. A communication system, comprising:
    an input port adapted to receive an analog signal;
    a first converter circuit, coupled to the input, the first converter circuit adapted to convert the analog signal to a digital output signal, the first converter circuit including:
        a first plurality of bandpass filters coupled to the input port that pass the analog signal in a plurality of different bands,
        a first plurality of adjustable amplifiers, each coupled to a corresponding one of the first plurality of bandpass filters, each adjustable amplifier further including a control input,
        an analog to digital converter having a first dynamic range, the digital to analog converter coupled to the output of each of the first plurality of adjustable amplifiers, and
        a signal processing circuit, coupled to the analog to digital converter, that is adapted to monitor the signal level in each of the plurality of different bands and to provide control signals to the first plurality of adjustable amplifiers so as to establish gain levels for each of the plurality of bands based on the output of the analog to digital converter so as to extend the first dynamic range of the analog to digital converter to a second, higher dynamic range;
    a communication link coupled to receive a digital signal from the analog to digital converter; and
    a second converter circuit, responsive to the communication link, that is adapted to convert the digital signal to an analog signal, the second converter circuit including:
        a digital to analog converter with a first dynamic range approximately equal to the dynamic range of the analog to digital converter,
        a second plurality of bandpass filters coupled to the digital to analog converter that pass the analog signal in a plurality of different bands,
        a second plurality of adjustable amplifiers, each coupled to a corresponding one of the second plurality of bandpass filters, each adjustable amplifier further including a control input, wherein the control input receives a signal from the signal processing circuit to adjust the gain of the adjustable amplifiers to extend the dynamic range of the digital to analog converter to reconstruct the input signal.

20. The system of claim 19, wherein each of the adjustable amplifiers of the first and second plurality of adjustable amplifiers comprises a plurality of stages that are selectively interconnected through a plurality of microelectromechanical switches to establish the gain level of the adjustable amplifier.

21. The system of claim 20, wherein each of the stages of the amplifiers the first plurality of amplifiers comprises an attenuator with an attenuation level that a power of 2 in dB.

22. The system of claim 19, wherein each of the adjustable amplifiers of the first plurality of adjustable amplifiers comprises:
    a first attenuation circuit;
    at least one additional attenuation circuit; and
    a plurality of microelectromechanical switches that selectively couple the first attenuation circuit and the at least one additional attenuation circuit between an input and an output of the adjustable attenuator so as to establish an attenuation level of the adjustable attenuator.

23. A method for extending the dynamic range of a communication circuit including first and second electronic circuits, the method comprising:
    receiving a signal;
    providing the signal to the first electronic circuit;
    monitoring signal levels of the signals applied to the first electronic circuit over a plurality of signal bands;
    generating a plurality of control signals based on the monitored signal levels;
    selectively adjusting the gain applied to the plurality of signal bands in response to the respective control signal to adjust the dynamic range of the signal applied to the first electronic circuit;
    passing the signal to the second electronic circuit; and
    selectively adjusting the gain applied to the plurality of signal bands with the same control signals to adjust the dynamic range of the signal applied to the second electronic circuit.

24. The method of claim 23, wherein receiving a signal comprises receiving an analog RF signal.

25. The method of claim 23, wherein monitoring signal levels comprise monitoring signals output by an analog to digital converter.

26. The method of claim 23, and further comprising setting an initial attenuation level for all signal bands prior to monitoring signal levels.

27. The method of claim 23, wherein providing the signal to the electronic circuit comprises providing the signal to an analog to digital converter.

28. A circuit for extending the dynamic range of an electronic circuit, the circuit comprising:

a first adjustable gain circuit having an input and an output and a control input, the control input adapted to receive a control signal that adjusts the relative gain of the gain circuit;

at least one additional gain circuit coupled in parallel with the first adjustable gain circuit, the at least one additional gain circuit having a control input adapted to receive a control signal that adjusts the relative gain of the at least one additional gain circuit; and wherein the first and the at least one additional gain circuits are selectively controlled in response to their respective outputs so as to adjust the level of signals in different frequency bands so as to extend the dynamic range of signals processed by the electronic circuit.

29. A circuit that extends the dynamic range of an electronic circuit, the circuit comprising:

an input adapted to receive an input signal;

a signal flattening circuit, responsive to the input, and controlled to flatten the input signal over a selected frequency range; and a control circuit, coupled to the electronic circuit, that provides control signals to the signal flattening circuit so as to extend the dynamic range of the electronic circuit.

* * * * *